United States Patent
He

(10) Patent No.: US 9,654,714 B2
(45) Date of Patent: May 16, 2017

(54) SHARED PIXEL WITH FIXED CONVERSION GAIN

(71) Applicant: Silicon Optronics, Inc., Hsinchu (TW)

(72) Inventor: Xinping He, Saratoga, CA (US)

(73) Assignee: Silicon Optronics, Inc., Hsinchu (TW)

( * ) Notice: Subject to any disclaimer, the term of this patent is extended or adjusted under 35 U.S.C. 154(b) by 0 days.

(21) Appl. No.: 14/109,834

(22) Filed: Dec. 17, 2013

(65) Prior Publication Data
US 2015/0124135 A1 May 7, 2015

Related U.S. Application Data

(63) Continuation-in-part of application No. 14/070,365, filed on Nov. 1, 2013.

(51) Int. Cl.
| H04N 5/374 | (2011.01) |
| H04N 5/341 | (2011.01) |
| H04N 5/369 | (2011.01) |
| H04N 5/378 | (2011.01) |
| H01L 27/146 | (2006.01) |
| H04N 5/3745 | (2011.01) |

(52) U.S. Cl.
CPC ... H04N 5/37457 (2013.01); H01L 27/14609 (2013.01); H04N 5/341 (2013.01); H04N 5/369 (2013.01); H04N 5/378 (2013.01); H04N 5/3742 (2013.01)

(58) Field of Classification Search
CPC .. H04N 5/37457; H04N 5/341; H04N 5/3742; H04N 5/378; H04N 5/369; H01L 27/14652; H01L 27/14609
See application file for complete search history.

(56) References Cited

U.S. PATENT DOCUMENTS

| 5,056,064 | A | 10/1991 | Iwahashi et al. |
| 5,541,654 | A | 7/1996 | Roberts |
| 5,565,915 | A | 10/1996 | Kindo et al. |
| 5,935,236 | A | 8/1999 | Wakimoto |
| 5,955,753 | A | 9/1999 | Takahashi |
| 6,339,363 | B1 * | 1/2002 | Fowler ............ H03F 3/087 250/214 A |
| 6,459,078 | B1 * | 10/2002 | Fowler ............ H04N 5/361 250/208.1 |
| 6,887,769 | B2 | 5/2005 | Kellar et al. |
| 6,960,757 | B2 | 11/2005 | Merrill et al. |

(Continued)

FOREIGN PATENT DOCUMENTS

| CN | 101193203 A | 6/2008 |
| EP | 1052846 A2 | 11/2000 |

(Continued)

OTHER PUBLICATIONS

U.S. Appl. No. 13/898,905, filed May 21, 2013, He.

(Continued)

*Primary Examiner* — Shahbaz Nazrul
(74) *Attorney, Agent, or Firm* — Perkins Coie LLP

(57) ABSTRACT

An active pixel sensor comprising: a plurality of pixels, wherein each pixel includes a light sensitive element and a transfer gate, and the plurality of pixels have at least one floating diffusion region; and a plurality of processing circuits associated with the plurality of pixels; wherein each processing circuit comprises a charge amplifier.

8 Claims, 8 Drawing Sheets

(56) References Cited

U.S. PATENT DOCUMENTS

| | | | |
|---|---|---|---|
| 6,984,816 B2 | 1/2006 | Holm et al. | |
| 7,115,925 B2 | 10/2006 | Rhodes | |
| 7,635,880 B2 | 12/2009 | Toros et al. | |
| 7,638,749 B2* | 12/2009 | Fowler | H04N 3/155 250/214 R |
| 7,764,396 B2 | 7/2010 | Yu | |
| 7,781,716 B2 | 8/2010 | Anderson et al. | |
| 7,791,192 B1 | 9/2010 | Joshi et al. | |
| 7,800,145 B2 | 9/2010 | Toros et al. | |
| 8,445,828 B2 | 5/2013 | He | |
| 8,460,794 B2 | 6/2013 | Zheng et al. | |
| 2003/0137594 A1 | 7/2003 | Koizumi et al. | |
| 2004/0227109 A1 | 11/2004 | Storm et al. | |
| 2005/0068838 A1 | 3/2005 | Kono et al. | |
| 2005/0128324 A1 | 6/2005 | Kishi et al. | |
| 2005/0205761 A1 | 9/2005 | Shah | |
| 2005/0274873 A1* | 12/2005 | Liu et al. | 250/208.1 |
| 2007/0132867 A1 | 6/2007 | Rhee et al. | |
| 2007/0189071 A1 | 8/2007 | Vali et al. | |
| 2007/0205495 A1* | 9/2007 | Fernandez et al. | 257/686 |
| 2008/0043128 A1 | 2/2008 | Poonnen et al. | |
| 2008/0083939 A1 | 4/2008 | Guidash | |
| 2008/0246869 A1 | 10/2008 | Krymski | |
| 2009/0091648 A1* | 4/2009 | Lin et al. | 348/301 |
| 2009/0096890 A1 | 4/2009 | Li | |
| 2009/0184349 A1 | 7/2009 | Dungan | |
| 2009/0189057 A1 | 7/2009 | Asaba et al. | |
| 2009/0230287 A1* | 9/2009 | Anderson | G02B 3/0056 250/208.1 |
| 2009/0294813 A1* | 12/2009 | Gambino | H01L 27/14632 257/292 |
| 2010/0060764 A1* | 3/2010 | McCarten | H01L 27/14641 348/308 |
| 2011/0156195 A1* | 6/2011 | Tivarus | H01L 27/14603 257/443 |
| 2011/0157398 A1 | 6/2011 | Okita et al. | |
| 2011/0157445 A1* | 6/2011 | Itonaga et al. | 348/308 |
| 2012/0002092 A1* | 1/2012 | Guidash | H01L 27/14634 348/308 |
| 2012/0019828 A1* | 1/2012 | McCaffrey | B01L 3/502707 356/432 |
| 2012/0091551 A1* | 4/2012 | Marenco | 257/432 |
| 2012/0147237 A1* | 6/2012 | Xu et al. | 348/301 |
| 2013/0134295 A1 | 5/2013 | Yan et al. | |
| 2013/0320194 A1* | 12/2013 | Chen | H01L 27/14634 250/208.1 |
| 2014/0027640 A1* | 1/2014 | Yang | H01L 27/14609 250/338.4 |
| 2014/0042298 A1* | 2/2014 | Wan | H01L 27/14634 250/208.1 |
| 2014/0042299 A1 | 2/2014 | Wan et al. | |
| 2014/0077057 A1* | 3/2014 | Chao | H01L 27/14634 250/208.1 |
| 2014/0104469 A1* | 4/2014 | Kim | H04N 5/378 348/297 |
| 2014/0211056 A1* | 7/2014 | Fan | H01L 27/14643 348/308 |
| 2014/0264683 A1 | 9/2014 | Kao et al. | |
| 2015/0122971 A1* | 5/2015 | He | H01L 27/14831 250/208.1 |

FOREIGN PATENT DOCUMENTS

| | | |
|---|---|---|
| TW | 200917827 | 4/2009 |
| WO | WO-2007136764 A2 | 11/2007 |
| WO | WO-2009035785 A1 | 3/2009 |

OTHER PUBLICATIONS

U.S. Appl. No. 14/070,365, filed Nov. 1, 2013, He.
U.S. Appl. No. 14/075,430, filed Nov. 8, 2013, He.
Jimmin Chang, A.A. Abidi, and C.R. Viswanathan, "Flicker noise in CMOS transistors from subthreshold to strong inversion at various temperatures", IEEE Trans. On Electron Devices, vol. 41, No. 11, pp. 1965-1971, Nov. 1994.

* cited by examiner

SHARED PIXEL WITH FIXED CONVERSION GAIN

CROSS-REFERENCE TO RELATED APPLICATION(S)

This application is a continuation in part application of U.S. patent application Ser. No. 14/070,365, entitled "3D STACKED IMAGE SENSOR", which was filed on Nov. 1, 2013, and incorporated herein by reference.

TECHNICAL FIELD

The present disclosure relates to image sensors, and more particularly, to a 3D stacked active pixel sensor with shared pixels.

BACKGROUND

An active pixel sensor (APS) combines a photodiode with processing and amplification circuitry in each pixel to form an image sensor. In some implementations, the associated circuitry is implemented with four transistors, and may be referred to as a 4 T APS. Such sensors are commonly found in devices such as cell phone cameras, digital cameras, and web cameras.

Smaller APS and smaller pixels are enabled by the improvements in semiconductor processing. A consequence of smaller pixel size is that the pixel's photodiode must also shrink to accommodate the smaller APS area. Less light is then able to fall on each pixel, and as a result image quality is reduced. Conventionally, as pixel size is getting smaller, a plurality of pixels share transistor(s) so to increase fill factor, which represents the percentage of the pixel area that is consumed by the actual photodiode, and is a higher-is-better (HB) metric.

However, when a plurality of pixels share a transistor, each pixel contributes additional parasitic capacitance to the pixel sensor. The higher capacitance of the pixel sensor results in a lower conversion gain (CG), which is undesirable.

It is desirable to maintain conversion gain when more pixels share electrical circuitry. Further, it is desired to have high CG, especially for high sensitivity under low illumination conditions.

SUMMARY OF THE INVENTION

In an embodiment, an active pixel sensor comprises a plurality of pixels and a plurality of processing circuit. Each pixel includes a light sensitive element and a transfer gate. The plurality of pixels include at least one floating diffusion region. The plurality of processing circuits are associated with the plurality of pixels. Each processing circuit comprises a charge amplifier.

BRIEF DESCRIPTION OF THE DRAWINGS

The present invention is illustrated in an exemplary manner by the accompanying drawings. The drawings should be understood as exemplary rather than limiting, as the scope of the invention is defined by the claims.

DETAILED DESCRIPTION

As will be discussed below, the disclosed embodiments allow for larger light sensitive elements in spite of shrinking image sensor circuit features through the use of a stacked configuration of sensor and circuit dies. Further, some of the disclosed embodiments achieve a stacked image sensor without requiring a floating diffusion region on the circuit die. Floating diffusion region is a combination of diffusion areas like drain of transfer transistor, source of reset transistor and parasitic capacitors associated therewith.

Figure 1:
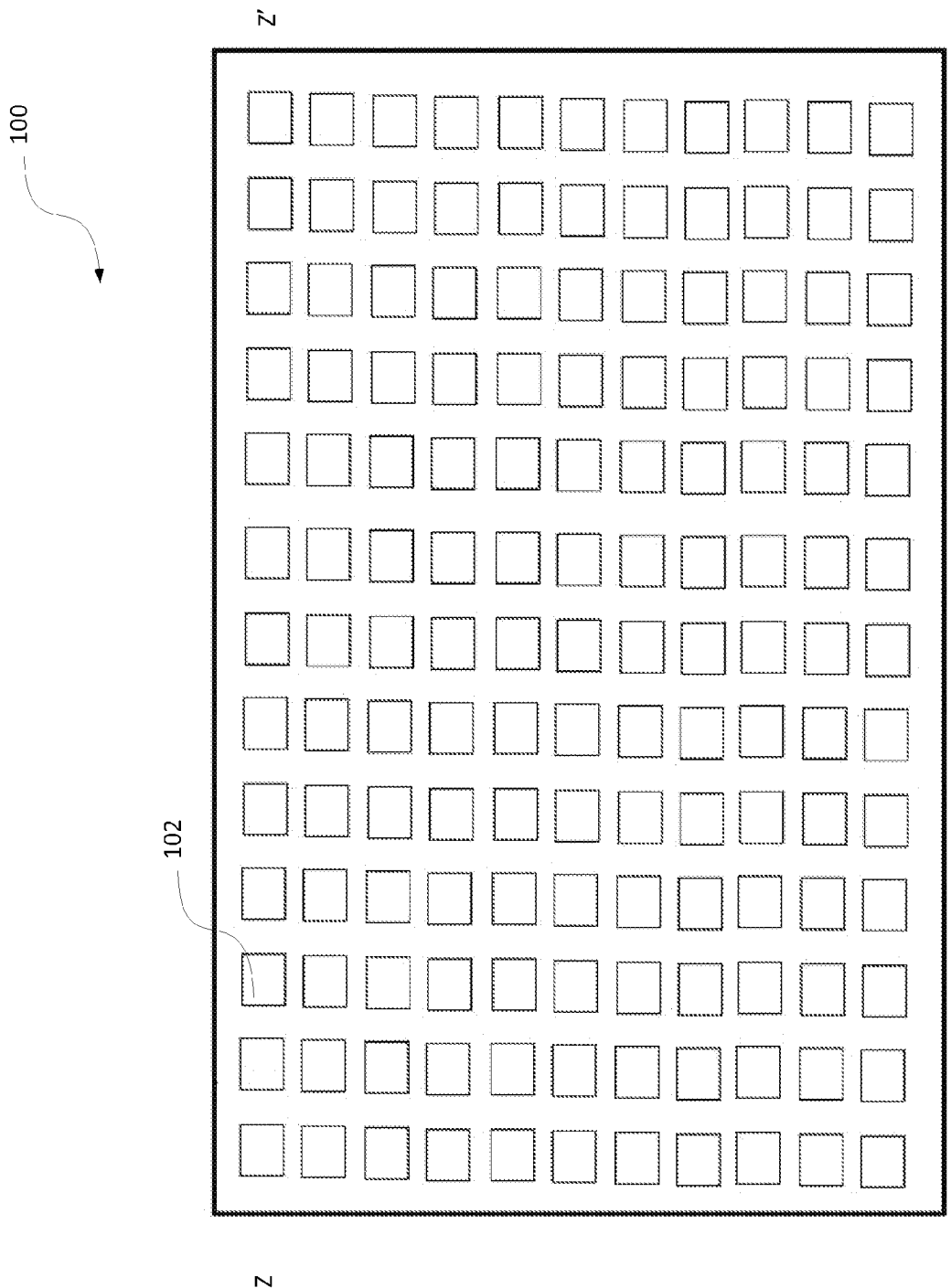
FIG. 1 is a plan view of a sensor die included in an image sensor having two stacked semiconductor dies according to an embodiment of the invention.

FIG. 1 is a plan view of a sensor die portion of an image sensor having two stacked semiconductor dies according to an embodiment of the invention. Image sensor 100 is implemented as an active pixel sensor (APS), such as, for example, a Complementary Metal-Oxide-Semiconductor Transistor (CMOS) image sensor. Image sensor 100 includes pixel regions 102 arranged in an array of rows and columns. Image sensor 100 can have any number of pixels regions, such as, for example, 1280 columns by 960 rows of pixel regions.

Figure 2:
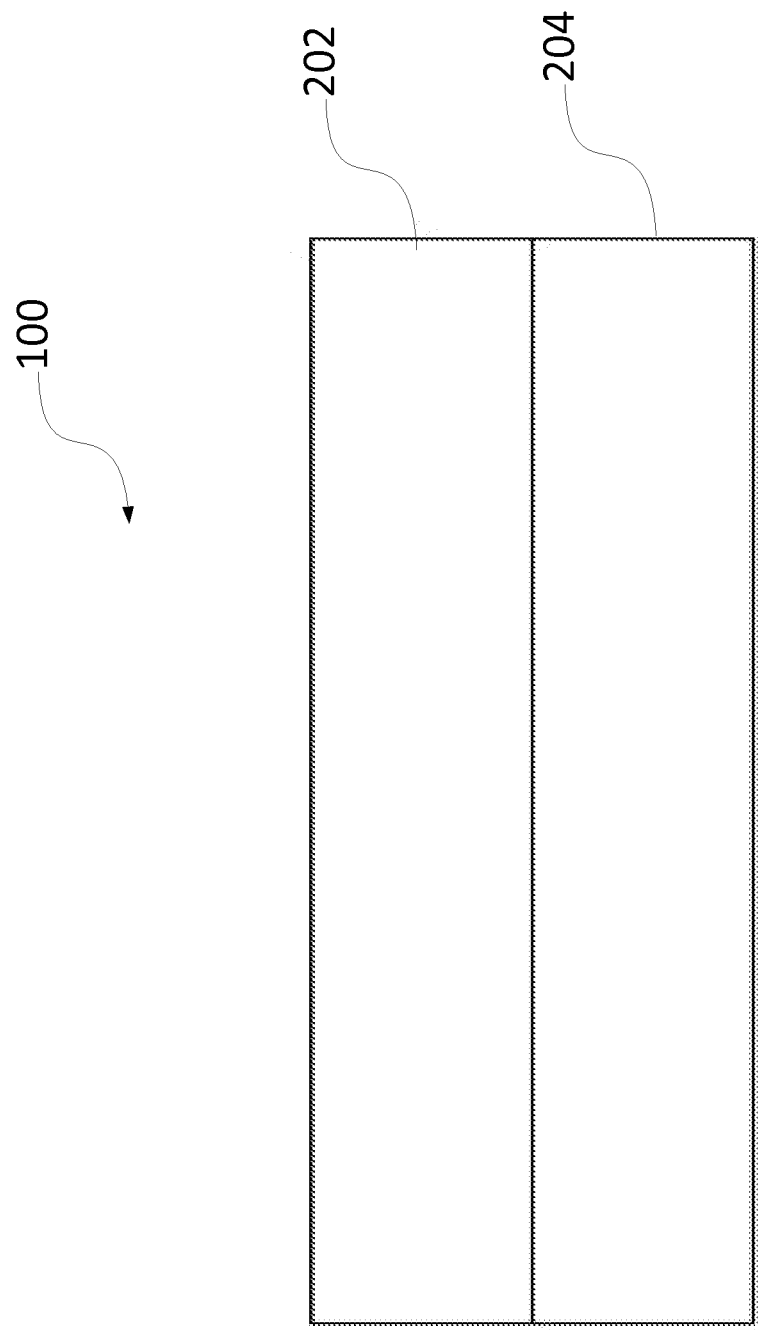
FIG. 2 is a cross-sectional view of two stacked semiconductor dies forming an image sensor of FIG. 1.

FIG. 2 is a cross-sectional view of two stacked semiconductor dies forming an image sensor of FIG. 1 along the section line Z-Z'. Image sensor 100 includes a sensor die 202 and a circuit die 204. In this view, it can be seen that the circuit die 204 is communicatively coupled to the sensor die 202. For example, the circuit die 204 may underlie the sensor die 202.

Figure 3:
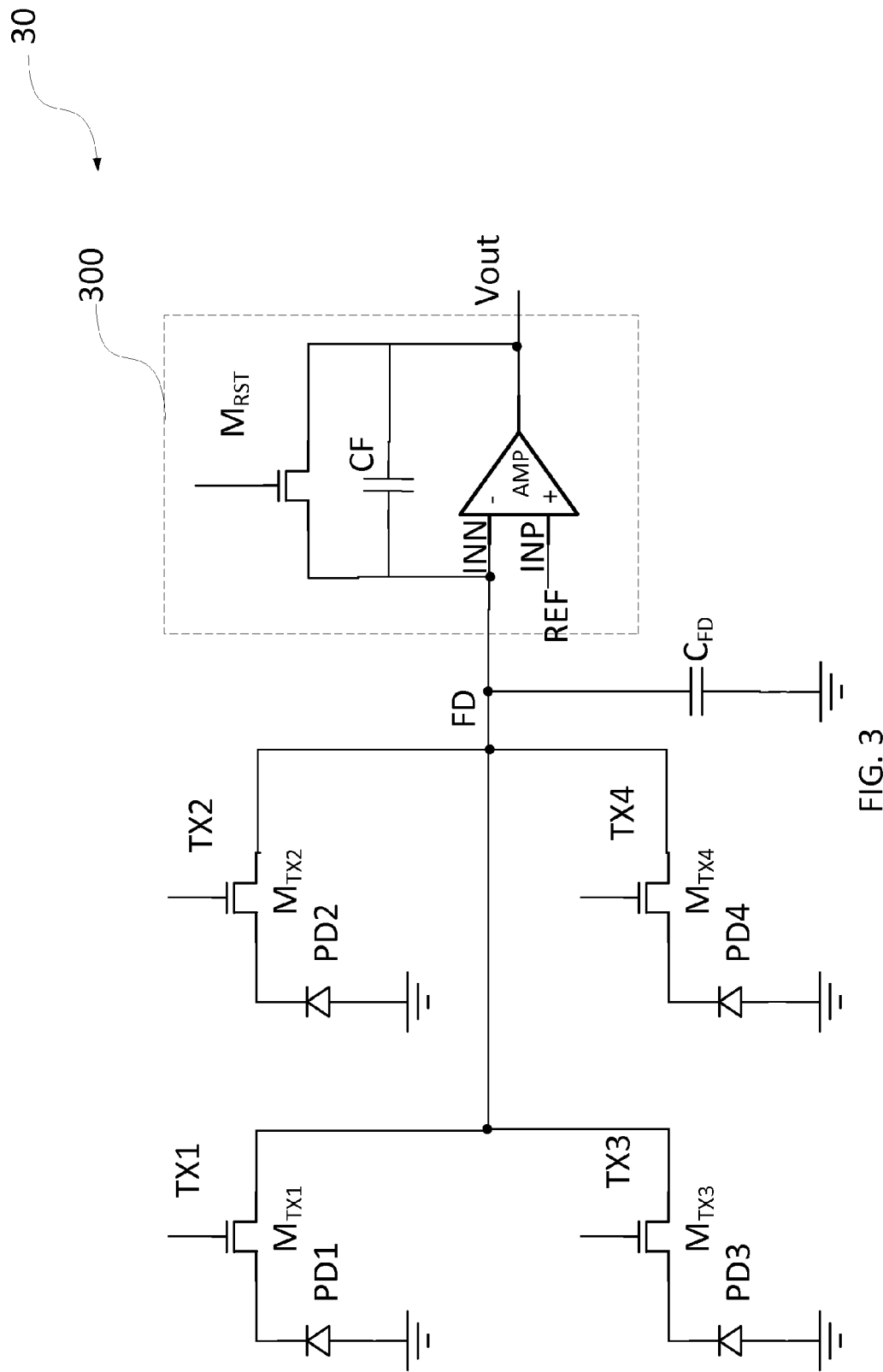
FIG. 3 is a circuit diagram illustrating an image sensor according to an embodiment of the invention.

FIG. 3 is a circuit diagram illustrating an image sensor according to an embodiment of the invention. An image sensor 30 utilizes a structure features that a plurality of pixels share a processing and amplification circuits 300 shown in the dashed line. As shown in FIG. 3, the image sensor 30 includes a first photodiode PD1, a first transfer gate $M_{Tx1}$, a second photodiode PD2, a second transfer gate $M_{Tx2}$, a third photodiode PD3, a third transfer gate $M_{Tx3}$, a fourth photodiode PD4, and a fourth transfer gate $M_{Tx4}$. Although only four pixels PD1, PD2, PD3 and PD4 are shown in FIG. 3, an image sensor 30 can include additional pixels in an embodiment in accordance with the invention. The image sensor 30 further includes the processing and amplification circuit 300. The processing and amplification circuit 300 comprises an amplifier AMP, a first capacitor CF, and a reset gate $M_{RST}$. The processing and amplification circuit 300 can also be called a charge amplifier, as the processing and amplification circuit 300 act a charge-to-voltage converter. Both the first reset gate $M_{RST}$ and the first capacitor CF are connected in parallel between an input INN of the amplifier AMP and an output Vout of the amplifier AMP. A reference signal is fed to a positive input INP of the amplifier AMP. REF represents a signal bus and is connected to a reference generator circuit in peripheral.

For examples, we have an array size 400×100=40K pixels. There will be 40K micro VIAs just for pixels. If 4 pixels share an amplifier AMP for example, the total micro VIAs to connect pixels will be 40,000/4=10K. Therefore shared pixel reduces number of micro VIAs.

However shared pixel causes higher parasitic capacitance in floating node, which translates to lower conversion gain. For example, transfer gate has drain area (diffusion) in floating node. There is parasitic capacitance between transfer gate poly gate and drain diffusion. In another example, each diffusion area has capacitance. Diffusion area cannot be shares when multiple pixels share floating area. The additional diffusion increases parasitic capacitance. The connection wires between multiple diffusion areas add more parasitic capacitance. Conversion Gain (CG) is a measure of voltage changes on floating node in response to the charge transferred from photoelectric converting device.

Lower conversion gain means that higher gain is needed to achieve required signal at same lighting condition, or higher noise. For example, amplifier AMP will generate noise, say "$N_{AMP}$." We use CG=100 uV/e⁻ and 200 uV/e⁻ as examples. The signal is 1000 electrons and an output signal 400 mV is desired. When CG=100 µV/e⁻, signal at the output bus Vout=100×10⁻³×1000+$N_{AMP}$=100+$N_{AMP}$ (mV). Additional 4 times gain is needed to achieve 400 mV signal. Signal=4×(100+$N_{AMP}$)=400+4×$N_{AMP}$ with noise "4×$N_{AMP}$". When CG=200 µV/e⁻, signal at the output bus Vout=200×10⁻³×1000+$N_{AMP}$=200+$N_{AMP}$ (mV). Additional 2 times gain is needed to achieve 400 mV signal. Signal=2×(200+$N_{AMP}$)=400+2×$N_{AMP}$ with noise "2×$N_{AMP}$". Assume 2× or 4× amplifier (not show in FIG. 3) does not introduce additional noise, it can be seen that under same situation except different conversion gains, in order to achieve the same output signal, the lower the conversion gain, the higher the noise will be generated.

Note that although FIG. 3 only shows one processing and amplification circuit 300 in the dashed block, those having ordinary skill in the art can understand that in actual application, an image sensor comprises a plurality of processing and amplification circuits.

Floating diffusion node FD is virtual ground if the amplify AMP is ideal, that is if the amplifier gain is infinite, which makes the voltage difference between the positive and negative inputs zero. The floating diffusion node FD will keep at constant voltage REF (the same as the voltage of negative input INP of the amplifier AMP) in this case. Note that in FIG. 3 the amplifier AMP has differential inputs INN and INP, those having ordinary skill in the art can understand that the amplifier may include a single-ended input instead of differential input ports. In the single-ended input scenario, the floating diffusion node FD is connected to the input of the amplifier. The floating node parasitic capacitance $C_{FD}$ will have no impact if the voltage doesn't change. When charge is transferred from photodiode PD to the floating diffusion region FD, and FD voltage is constant (i.e., charge maintains constant in parasitic capacitors), the equal number of opposite charge must come from somewhere else to the floating diffusion region FD. Those opposite charges come from the first capacitor CF. Conversion gain means how much voltage will be with one electron. So conversion gain can be represented as $$CG = \frac{q}{C_F} = \frac{1.6 \times 10^{-19}}{C_F}.$$

Therefore, the conversion gain for this embodiment can be represented as $$CG = \frac{e^-}{C_F}.$$

Wherein e⁻ represents an electron, and $C_F$ represents the capacitance of first capacitor CF.

Figure 4:
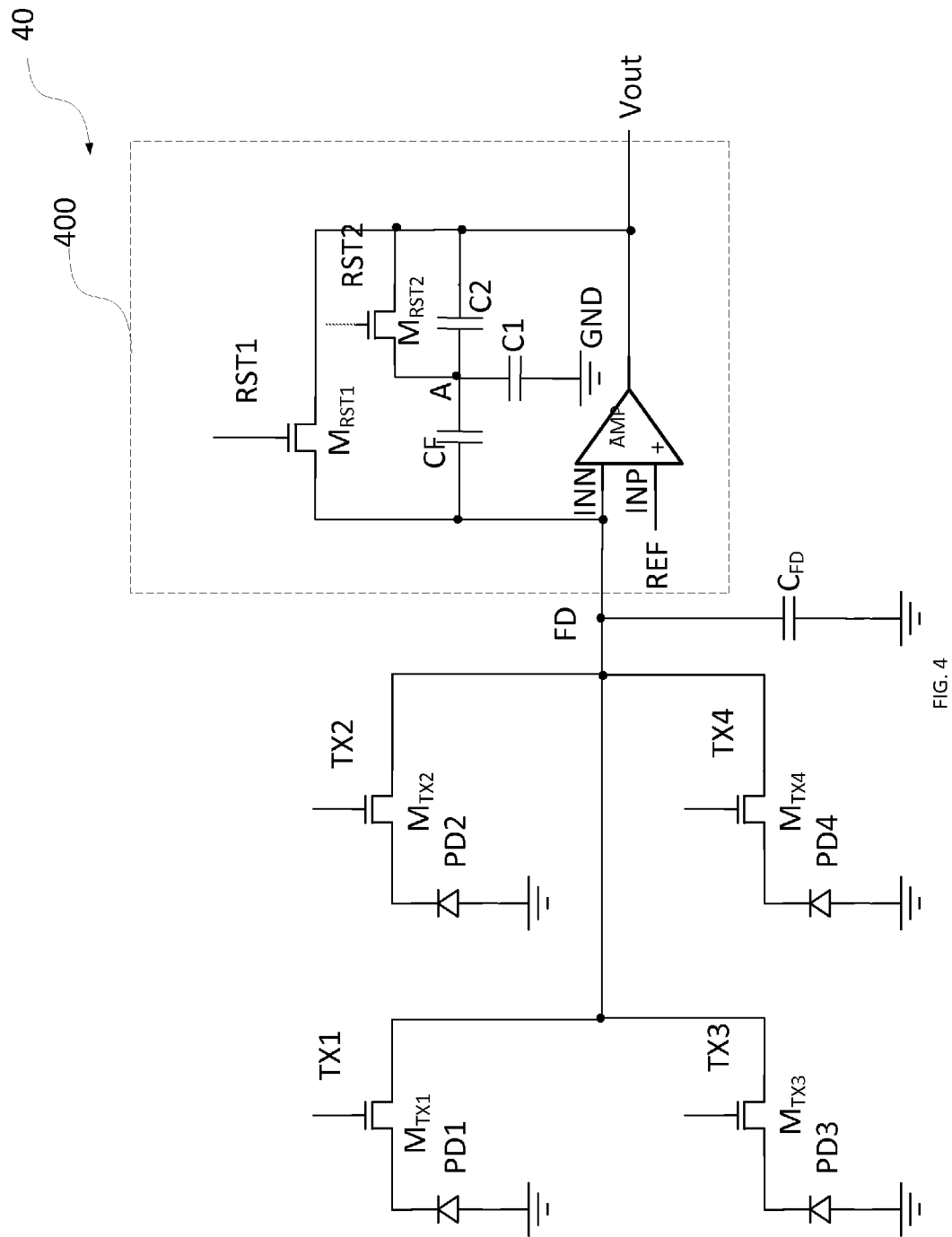
FIG. 4 is a circuit diagram illustrating an image sensor according to an embodiment of the invention.

FIG. 4 is a circuit diagram illustrating another embodiment of the invention. In addition to the first capacitor CF, the first reset gate $M_{RST1}$, the processing and amplification circuit 400 further comprises a second capacitor C2, a third capacitor C1 and a second reset gate $M_{RST2}$, wherein the first reset gate $M_{RST1}$ is connected between the input of the amplifier AMP and the output of the amplifier AMP, the second capacitor C2 is connected in series with the first capacitor CF between the negative input INN of the amplifier AMP and the output Vout of the amplifier AMP, the second reset gate $M_{RST2}$ is connected in parallel with the second capacitor C2, and the third capacitor C1 is connected between a connecting point A of the first capacitor CF and the second capacitor C2 and a fixed reference voltage. The fixed reference voltage may comprise the ground GND as shown in FIG. 4, or a VDD. The conversion gain in this scenario will be discussed in further details with reference to the following FIG. 5.

Figure 5:
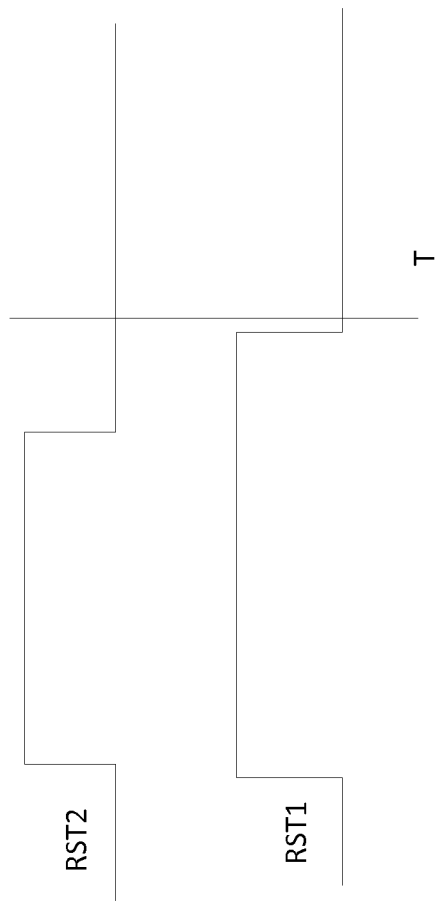
FIG. 5 is a diagram illustrating the timing sequence of the first reset signal and the second reset signal.

FIG. 5 is a diagram illustrating the timing sequence of the first reset signal and the second reset signal. As shown in FIG. 5, at time T, both RST1 and RST2 are off. Reset finishes, and assume no charge injections are generated from the two reset transistors $M_{RST1}$ and $M_{RST2}$, then in conjunction with the circuit diagram of FIG. 4, $V(FD)=\text{REF}, V(A)=\text{REF}, V(V\text{out})=\text{REF},$ wherein REF represents the voltage of the reference signal bus.

$Q(FD)=C_{FD}\times\text{REF}, Q(A)=C_1\times\text{REF}$

Then, assume a charge "q" is transferred to floating node, then $V(FD)=\text{REF}, V(A)=VA, V(V\text{out})=V\text{out}$ And there are constant charge numbers in both nodes "FD" and "A," then $Q(FD)=C_{FD}\times\text{REF}+q+C_F\times(\text{REF}-VA)=C_{FD}\times\text{REF}$ $Q(A)=C_F\times(VA-\text{REF})+C_2\times(VA-V\text{out})+C_1\times VA=C_1\times\text{REF}$ From the two equations above, we have $$V\text{out} = \text{REF} + \frac{q}{C_F} \times \frac{C_1 + C_2 + C_F}{C_2}.$$

Therefore, for the circuit shown in FIG. 4, the conversion gain CG can be represented as $$CG = \frac{e^-}{C_F} \times \frac{C_F + C_1 + C_2}{C_2}.$$

With the above embodiment, Photo Response Non Uniformity (PRNU) can be improved. Basically, the signal should be same if same amount of photons hit a pixel. The variation of each pixel in response to the photon is called PRNU. The matching of CF becomes worse when CF is smaller, then the variation of conversion gain is bigger, i.e., PRNU is getting worse. There are many processing and amplification circuits 400 in pixel array. CF in every processing and amplification circuit 400 will be slightly different due to manufacturing variations. The smaller the CF, the higher percentage of the difference. For example, CF depends on the area of CF. Assume CF size is 10×10 and process variation (in each direction) is 1, the CF area ranges from 9×9 to 11×11. Max/Min==$11^2/9^2$=1.49. Alternatively, when CF is increased to 100×100 with same process variation, CF area ranges from 99×99 to 101×101. Max/Min=$101^2/99^2$=1.04. Increased CF improves PRNU.

Further, $$\frac{C_1}{C_2}$$

ratio can be adjusted to meet the CG requirement. The $$\frac{C_1}{C_2}$$

ratio can be adjusted based on process variations. For example, the minimum area to achieve reasonable uniformity is 100. CG is 10 when use area 100 capacitor using circuit in 300 of FIG. 3. In order to achieve CG=100, CF(area) needs to be 10. Area 10 is too small that will cause large non uniformity. Therefore in order to achieve CG=100 with reasonable uniformity, an effective capacitance is needed which is 10 times smaller which uses 400 of FIG. 4. Therefore, CF(area)=100, and C2(area)=100 are picked. As $$CG = \frac{e^-}{C_F} \times \frac{C_F + C_1 + C_2}{C_2},$$

$$CF'(\text{area}) = \frac{C_F \times C_2}{C_F + C_1 + C_2}$$
$$= \frac{100 \times 100}{100 + 100 + C_1}$$
$$= 10,$$

therefore C1=800.

Therefore in FIG. 4, when CF(area)=100, C1(area)=800, C2(area)=100, CG=100. Since area of each capacitor is above 100, the uniformity is better.

Alternatively or in addition, the floating diffusion region is covered with metal layer. Assume many pixels share one amplifier. Then all drain nodes of transfer gates are connected together. In the case we have a very strong light hit one pixel (including the drain node of transfer gate), the entire floating node bus is constantly exposed. It is like pixels connected to this floating node bus are all very bright, which is called smear. Those of ordinary skill in the art can understand that when the floating diffusion region is covered with metal layer, which means that each floating node is covered with metal light shielding, the smear effect can be eliminated or alleviated.

Figure 6:
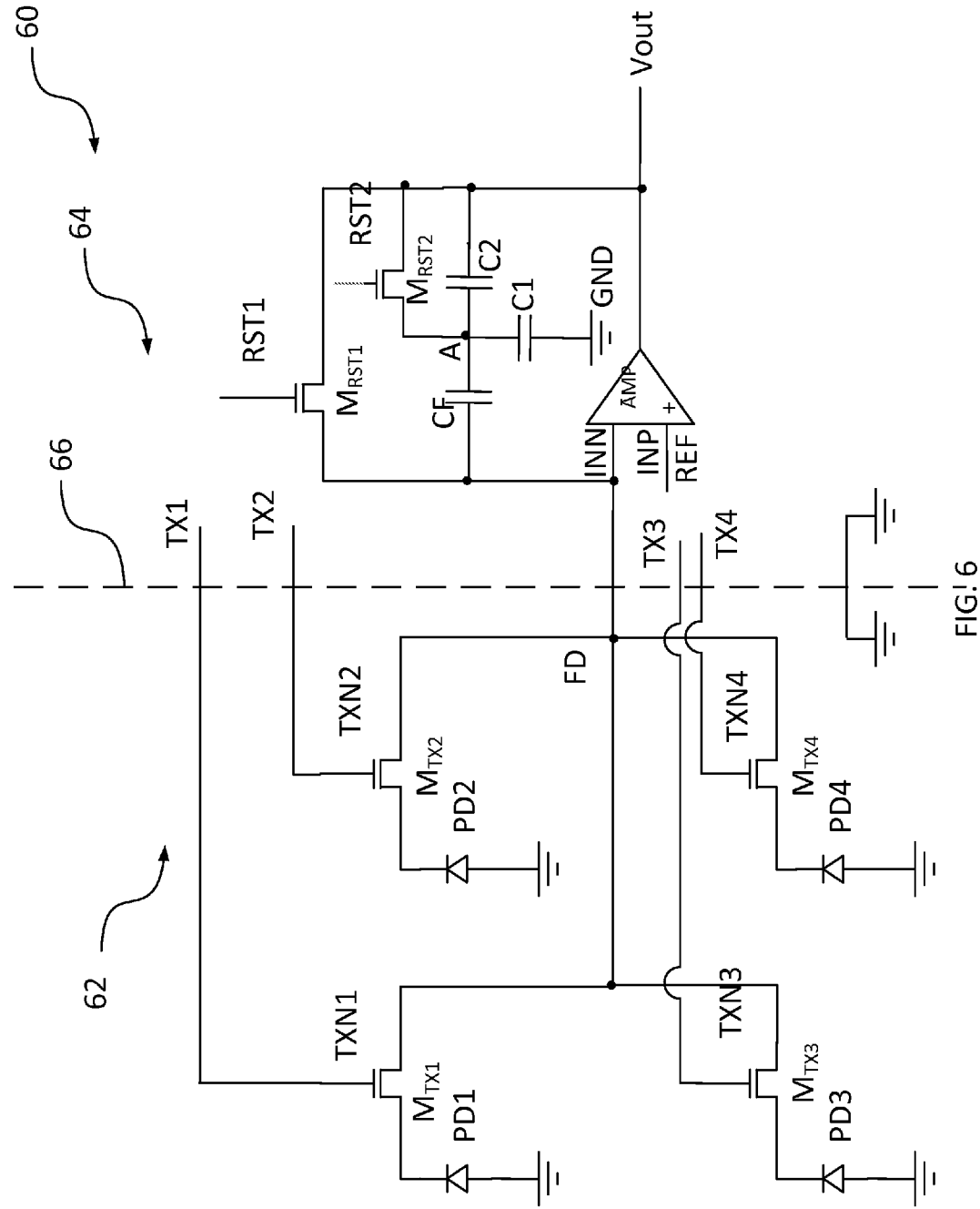
FIG. 6 is a circuit diagram illustrating an image sensor according to an embodiment of the invention.

FIG. 6 is a circuit diagram illustrating an image sensor according to an embodiment of the invention. In FIG. 6, same reference signs represent same elements in the active pixel sensor 40 shown in FIG. 4 the detail descriptions of which are omitted. The dotted line 66 represents a die border between two dies 62 and 64. As shown in FIG. 6, all of the reset signal bus RST and the transfer signal buses TX1, TX2, TX3 and TX4 are located in the circuit die 64, so as to save space on the sensor die 62 for accommodating a larger photo detector on the sensor die 62. In other words, the transfer nodes TXN1, TXN2, TXN3 and TXN4 on the sensor die 62 each is interconnected to its corresponding transfer signal bus TX1, TX2, TX3 and TX4 in the circuit die 64. The transfer gates $M_{TX1}$, $M_{TX2}$, $M_{TX3}$ and $M_{TX4}$ are in the same die as the photodiodes PD1, PD2, PD3 and PD4 so to avoid contact requirements. The photodiodes PD1, PD2, PD3 and PD4 each is surrounded with pure silicon crystal so to avoid defect which may lead to dark current, or defect pixel, etc. The ground bus in FIG. 6 is located in the circuit die 64. There is ground connection between the sensor die 62 and the circuit die 64.

Figure 7:
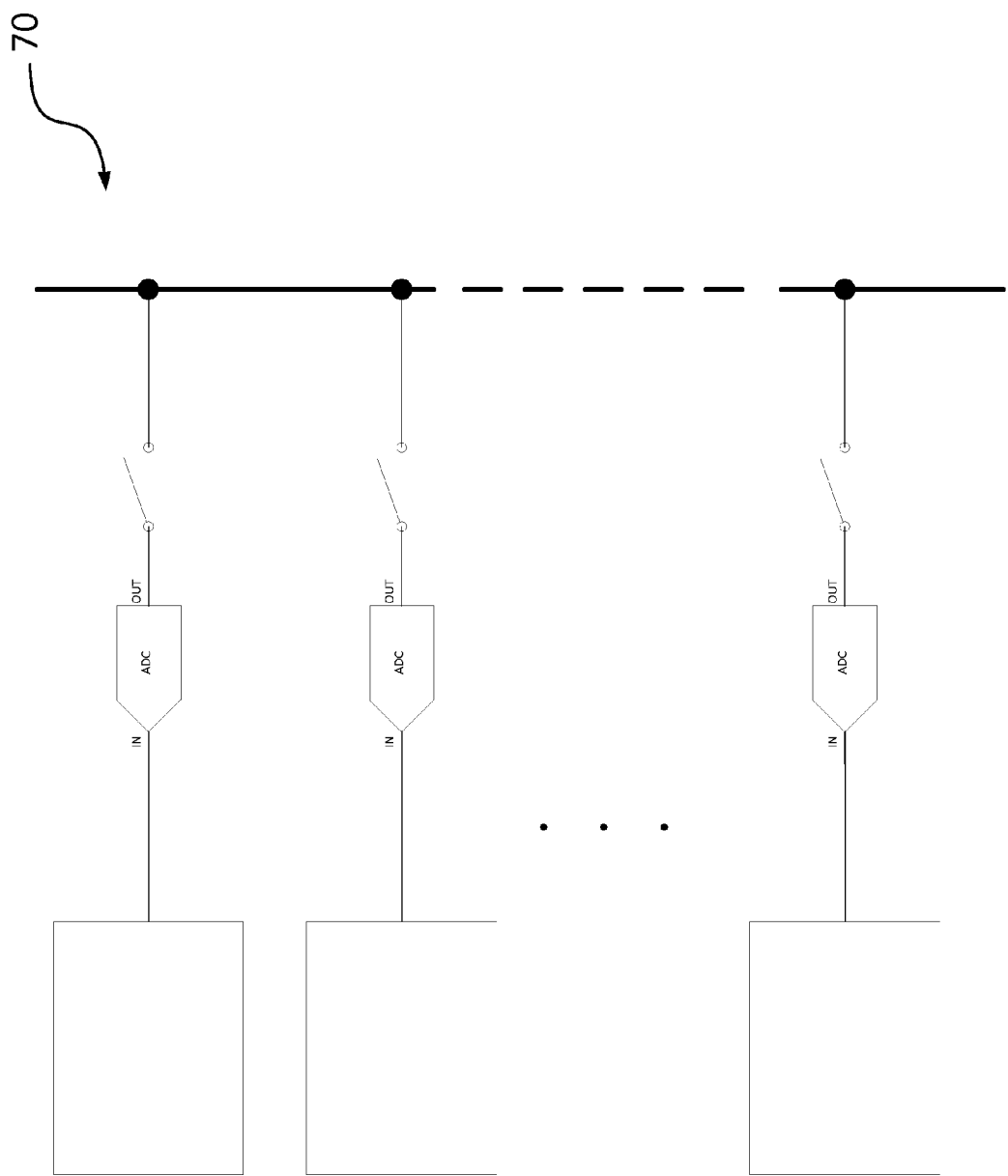
FIG. 7 is a circuit diagram showing a high-level structure including the image sensor according to an embodiment of the invention.

FIG. 7 is a circuit diagram showing a high-level structure including the image sensor according to an embodiment of the invention. In FIG. 7, each charge amplifier shown as a block is followed by an analog-to-digital converter (ADC) and there is no need for a separate switch.

Figure 8:
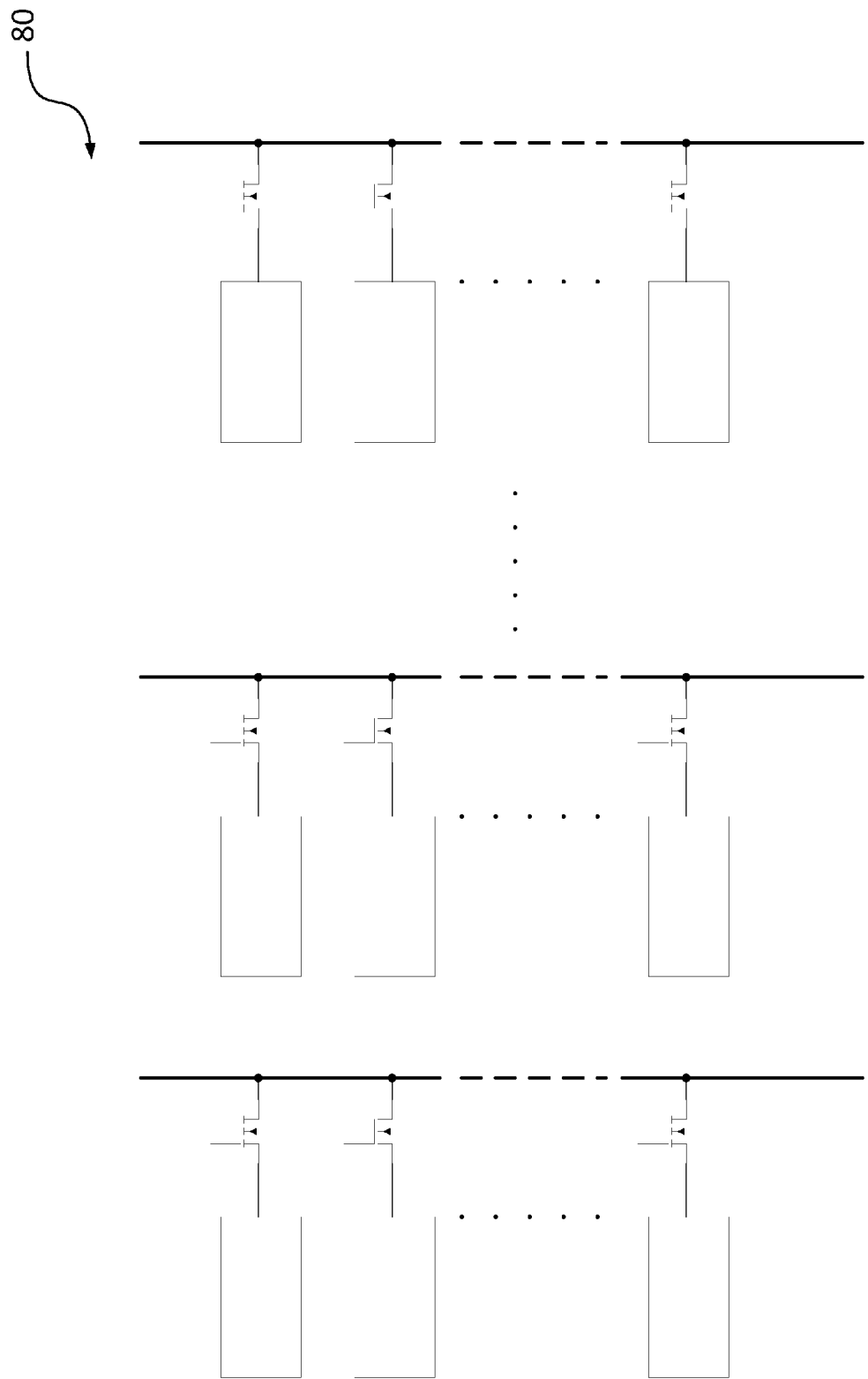
FIG. 8 is a circuit diagram showing a high-level structure including the image sensor according to another embodiment of the invention.

FIG. 8 is a circuit diagram showing a high-level structure including the image sensor according to another embodiment of the invention. In FIG. 8, each charge amplifier shown as a block is followed by a switch. The switch can be implemented by a N-channel metal-oxide-semiconductor field-effect transistor (NMOS).

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. For example, embodiments of the present invention may be applied to image sensors having different types of light sensing devices, such as photodiodes, photogates, pinned photodiodes, and equivalents. Moreover, features of one embodiment may be incorporated into other embodiments, even where those features are not described together in a single embodiment within the present document. Accordingly, the invention is described by the appended claims.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Even if certain features are recited in different dependent claims, the present invention also relates to an embodiment comprising these features in common. Any reference signs in the claims should not be construed as limiting the scope.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims.

Accordingly, the specification and drawings are to be regarded in an illustrative sense rather than a restrictive sense.

I claim:

1. An active pixel sensor comprising:
   a plurality of pixels, wherein each pixel includes a light sensitive element and a transfer gate, and the plurality of pixels have at least one floating diffusion region; and
   a plurality of processing circuits associated with the plurality of pixels;
   wherein each processing circuit comprises a charge amplifier, wherein the charge amplifier comprises a feedback path, the charge amplifier is used for conversion gain, and the conversion gain is determined by the ratio of two capacitors in the feedback path, wherein the conversion gain equals 100 uV/e$^-$,
   wherein the charge amplifier comprises an amplifier, a first reset gate, a first capacitor, a second capacitor, a third capacitor and a second reset gate, wherein the second capacitor is connected in series with the first capacitor between the input of the amplifier and the output of the amplifier, the first reset gate is connected between the input of the amplifier and the output of the amplifier, the second reset gate is connected in parallel with the second capacitor, and the third capacitor is connected between a connecting point of the first capacitor and the second capacitor and a fixed reference voltage,
   wherein the fixed reference voltage includes a power supply.

2. The active pixel sensor of claim 1, wherein a processing and amplification circuit is shared by an amount of pixels.

3. The active pixel sensor of claim 2, wherein the processing and amplification circuit and the amount of pixels are within a die.

4. The active pixel sensor of claim 2, wherein the amount of pixels are in a sensor die, and the processing and amplification circuit is in a circuit die different from the sensor die.

5. The active pixel sensor of claim 4, wherein a ground of the sensor die is connected to a ground signal bus located in the circuit die.

6. The active pixel sensor of claim 1, wherein the floating diffusion region is covered with metal layer.

7. The active pixel sensor of claim 1, wherein the light sensitive element comprises a photodiode.

8. The active pixel sensor of claim 1, wherein the plurality of pixels share a floating diffusion region.

* * * * *